US006720928B2

(12) United States Patent
Honma

(10) Patent No.: US 6,720,928 B2
(45) Date of Patent: Apr. 13, 2004

(54) PARALLEL DISPLACEMENT/INCLINATION MEASURING APPARATUS AND ANTENNA SYSTEM

(75) Inventor: Yukihiro Honma, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/279,080

(22) Filed: Oct. 24, 2002

(65) Prior Publication Data

US 2003/0197655 A1 Oct. 23, 2003

(30) Foreign Application Priority Data

Apr. 22, 2002 (JP) ....................................... 2002-118869

(51) Int. Cl.[7] ................................................ G01R 1/24
(52) U.S. Cl. ........................ 343/703; 343/757; 343/763
(58) Field of Search ................................ 343/703, 757, 343/832, 833, 834, 840, 912, 878, 761

(56) References Cited

U.S. PATENT DOCUMENTS 6,509,973 B2 * 1/2003 Kiyoi et al. ................ 356/606
6,522,411 B1 * 2/2003 Moon et al. ................ 356/505

FOREIGN PATENT DOCUMENTS

JP 2560475 9/1996
JP 2001-66110 3/2001

* cited by examiner

*Primary Examiner*—Tuyet T. Vo
(74) *Attorney, Agent, or Firm*—Oblon, Spivak, McClelland, Maier & Neustadt, P.C.

(57) ABSTRACT

A laser pointer and an image sensor are employed as one measuring system, and two measuring systems are arranged such that a laser beam is irradiated in the opposite direction. One laser pointer and one image sensor are arranged on the measuring reference portion, and also One laser pointer and one image sensor are arranged on the measured portion. The parallel displacement ΔX and the inclination θ of the measured portion are calculated separately based on measured results obtained by these two measuring systems.

6 Claims, 6 Drawing Sheets

PARALLEL DISPLACEMENT/INCLINATION MEASURING APPARATUS AND ANTENNA SYSTEM

BACKGROUND OF THE INVENTION

1. Field of the Invention

The present invention relates to a measuring apparatus for measuring relative parallel displacement/inclination of the measured portion to the measuring reference portion in the precision measuring technology field, and an antenna system equipped with this measuring apparatus to correct the pointing error.

2. Description of the Related Art

In the field of the radio astronomy, for example, recently the request for the observation of the radio wave with a higher frequency from a millimeter wave to a submillimeter wave is being increased. If the observation of the radio-wave celestial sphere is carried out by the high frequency, the higher precision is required in the directivity tracking of the reflecting mirror surface of the telescope and the beam. In contrast, the larger aperture size of the telescope is accelerated in order to increase the observation efficiency, and also it is required to make all weather observation at day and night. Since the aperture size is increased, the self-weight deformation of the telescope is increased, otherwise the thermal deformation due to the solar radiation or the deformation due to the wind pressure is increased. Therefore, it is difficult to get the high directivity tracking precision. In order to satisfy the request for such high directivity tracking precision, the technology for measuring/correcting the pointing error of the reflecting mirror of the telescope in real time is needed.

FIG. 6 is a configurative view showing an antenna angle sensing system shown in the Unexamined Japanese Patent Application Publication No. Hei 3-3402, for example, in the prior art. In FIG. 6, 1 is a main reflecting mirror, 2 is an antenna pedestal, and 3 is an AZ angle sensor of the antenna, which is fixed to the antenna pedestal 2. Also, 4 is an EL angle sensor of the antenna, 5 is an EL angle sensor that is the same type as the EL angle sensor 4 or a mount having only a case that is the same as the EL angle sensor. Also, 6 is a light beam generator and two light beam generators 6 are provided on the AZ angle sensor 3, and 7 is an AZ-axis optical position sensor provided on the EL angle sensors 4 and 5 respectively. The beam emitted from the light beam generator 6 is irradiated onto the AZ-axis optical position sensor 7. Also, 8 is a light beam generator that is provided on the EL angle sensors 4 and 5 respectively, and 9 is an EL-axis optical position sensor that is provided on the AZ angle sensor 3. The beam emitted from the light beam generator 8 is irradiated onto the EL-axis optical position sensor 9. The AZ-axis optical position sensor 7 and the EL-axis optical position sensor 9 are constructed by a two-split photo diode, and are arranged to sense the beam deviation only in the Y-axis direction.

Next, an operation will be explained hereunder. If the antenna pedestal 2 is deformed, the twist deformation upon the axis and the parallel deformation are generated. In the system shown in FIG. 6, two sets of the light beam generators 6 and the AZ-axis optical position sensors 7 are provided for the AZ axis, and two sets of the light beam generators 8 and the EL-axis optical position sensors 9 provided for the EL axis.

An amount of twist in the AZ axis is calculated based on the difference between outputs of two sets of the AZ-axis optical position sensors 7, and also an amount of twist in the EL axis is calculated based on the difference between a sum of outputs of two sets of the EL-axis optical position sensors 9 and a sum of outputs of two sets of the AZ-axis optical position sensors 7. The direction of the true antenna directivity is calculated by adding/subtracting respective amounts of twist of the axes, which are sensed in this manner, to/from angle signals that are sensed by the EL angle sensors 4, 5 and the AZ angle sensor 3 respectively.

Since the antenna angle sensing system in the prior art is constructed as above, the optical position sensors and the light beam generators must be arranged on the EL angle sensors and the AZ angle sensor. Therefore, there was such a problem that the arrangement of these devices puts the restriction on the antenna structure. Also, the employed sensors are the optical position sensor that senses the light beam. Therefore, there was another problem such that there is such a restriction that the marker for indicating the displacement of the measured site must be constructed by the high-output light beam generator. In addition, in the antenna angle sensing system in the prior art, the outputs of the angle sensors in respective axes are corrected based on the true directivity that was sensed. In this case, particularly the pointing error at the high frequency cannot be corrected by correcting only the outputs of the angle sensors, and thus there was still another problem such that the high antenna directivity tracking precision cannot be achieved.

SUMMARY OF THE INVENTION

The present invention is made to overcome the above-problem, and it is an object of the present invention to provide a parallel displacement/inclination measuring apparatus capable of measuring a parallel displacement and an inclination of the measured portion with the small restriction on arrangement of measuring devices and an antenna system for correcting the antenna pointing error by using this parallel displacement/inclination measuring apparatus.

A parallel displacement/inclination measuring apparatus according to the invention set forth in Aspect 1 comprises a first marker for indicating a position provided to a measuring reference portion; a first image sensor provided to a measured portion to oppose to the first marker; a second marker for indicating a position provided to the measured portion; a second image sensor provided to the measuring reference portion to oppose to the second marker; a position calculating portion for calculating positions of the first marker and the second marker, which are picked up by the first image sensor and the second image sensor; and a displacement/inclination calculating portion for calculating a parallel displacement and an inclination of the measured portion, based on the positions of the first marker and the second marker calculated by the position calculating portion.

An antenna system according to the invention set forth in Aspect 2 comprises an antenna pedestal for supporting an elevation angle driving axis of an antenna; a first marker for indicating a position provided to a top portion of the antenna pedestal; a first image sensor provided to a bottom portion of the antenna pedestal to oppose to the first marker; a second marker for indicating a position provided to the bottom portion of the antenna pedestal; a second image sensor provided to the top portion of the antenna pedestal to oppose to the second marker; a position calculating portion for calculating positions of the first marker and the second marker, which are picked up by the first image sensor and the second image sensor; and a displacement/inclination calculating portion for calculating a parallel displacement and an inclination of the top portion of the antenna pedestal, based on the positions of the first marker and the second marker calculated by the position calculating portion.

An antenna system according to the invention set forth in Aspect 3 comprises an antenna pedestal for supporting an elevation angle driving axis of an antenna; first markers for indicating positions provided to right and left portions of a top portion of the antenna pedestal respectively; first image sensors provided to right and left portions of a bottom portion of the antenna pedestal respectively to oppose to the first markers; second markers for indicating positions provided to right and left portions of the bottom portion of the antenna pedestal respectively; second image sensors provided to right and left portions of the top portion of the antenna pedestal respectively to oppose to the second markers; a position calculating portion for calculating positions of the first markers and the second markers, which are picked up by the first image sensors and the second image sensors; a displacement/inclination calculating portion for calculating parallel displacements and inclinations of the right and left portions of the top portion of the antenna pedestal, based on the positions of the first markers and the second markers calculated by the position calculating portion; and a pointing error calculating portion for calculating an antenna pointing error based on the parallel displacements and the inclinations of the right and left portions of the top portion of the antenna pedestal calculated by the displacement/inclination calculating portion.

In the antenna system according to the invention set forth in Aspect 3, the antenna system according to the invention set forth in Aspect 4 further comprises an antenna driving portion for driving the antenna on an azimuth angle or elevation angle axis based on the antenna pointing error calculated by the pointing error calculating portion to correct a direction of an antenna directivity.

In the antenna system according to the invention set forth in Aspect 3, the antenna system according to the invention set forth in Aspect 5 further comprises a subreflector driving portion for driving a subreflector based on the antenna pointing error calculated by the pointing error calculating portion to correct a direction of an antenna directivity.

In the antenna system according to the invention set forth in Aspect 3, the antenna system according to the invention set forth in Aspect 6 further comprises a high-speed driven mirror driving portion for driving a high-speed driven mirror based on the antenna pointing error calculated by the pointing error calculating portion to correct a direction of an antenna directivity.

DETAILED DESCRIPTION OF THE PREFERRED EMBODIMENTS (Embodiment 1)

Figure 1:
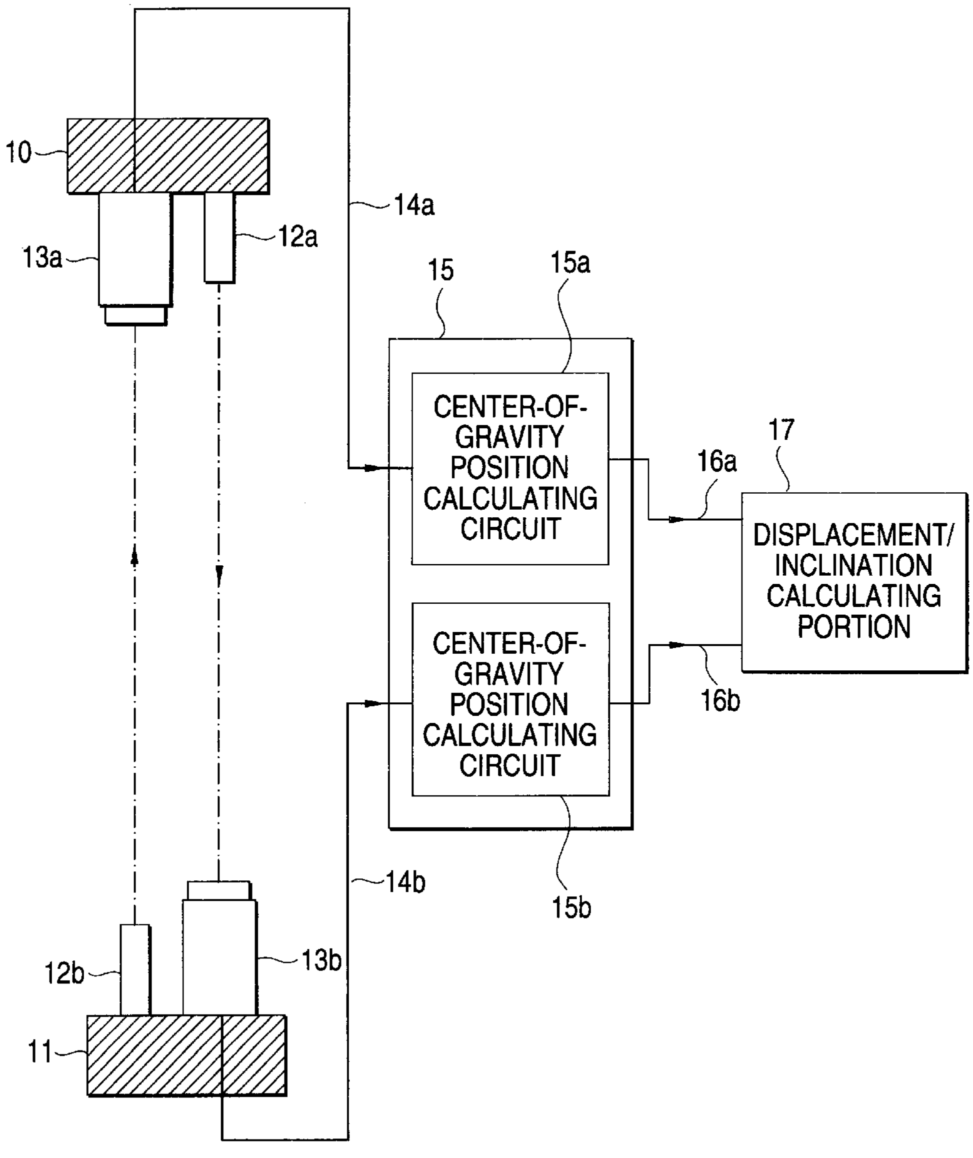
FIG. 1 is a configurative view showing an example of a parallel displacement/inclination measuring apparatus according to an embodiment 1 of the present invention.

A parallel displacement/inclination measuring apparatus according to an embodiment 1 of the present invention will be explained with reference to FIG. 1 hereunder. FIG. 1 is a configurative view showing an example of the parallel displacement/inclination measuring apparatus according to the embodiment 1. In FIG. 1, 10 is a measured portion whose displacement and inclination are measured, and 11 is a measuring reference portion serving as a measuring reference. Also, 12*a* and 12*b* are laser pointers serving as a marker, 13*a* and 13*b* are two-dimensional image sensors that pick up images of the laser pointers 12*a* and 12*b*, and 14*a* and 14*b* are image data that are output from the image sensor 13*a* and the image sensor 13*b*. Also, 15 is a position calculating portion that calculates a center of gravity of the laser beam emitted from the laser pointers 12*a* and 12*b* respectively. The image data 14*a* and 14*b* are input into center-of-gravity position calculating circuits 15*a* and 15*b* respectively, and their centers of gravity are calculated. Also, 16*a* and 16*b* are center-of-gravity data of the leaser beams, which are calculated by the center-of-gravity position calculating circuits 15*a* and 15*b*, and 17 is a displacement/inclination calculating portion that calculates the displacement and the inclination of the measured portion from the center-of-gravity data 16*a* and 16*b*.

Figure 2:
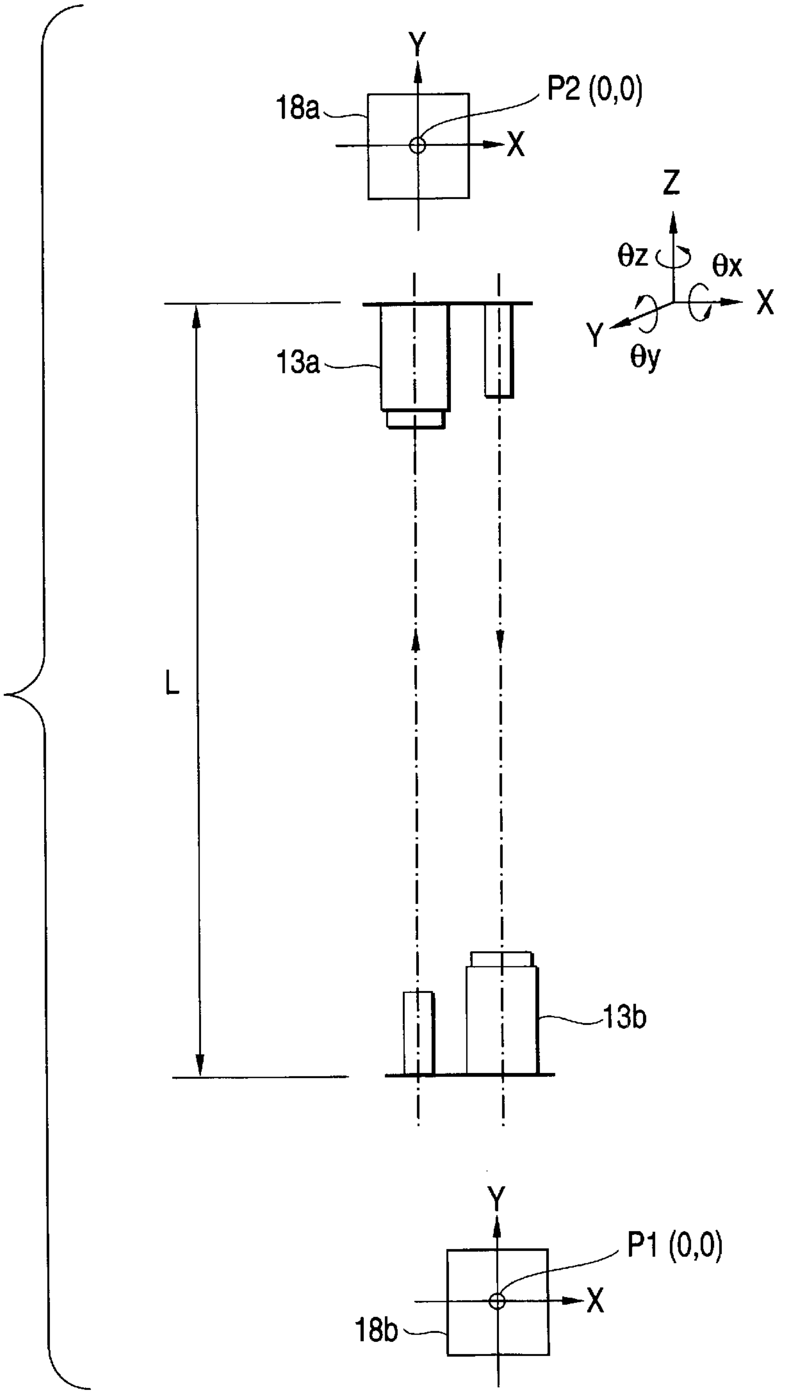
FIG. 2 is a schematic view showing the principle of the parallel displacement/inclination measuring apparatus according to the embodiment 1 of the present invention.
Figure 3:
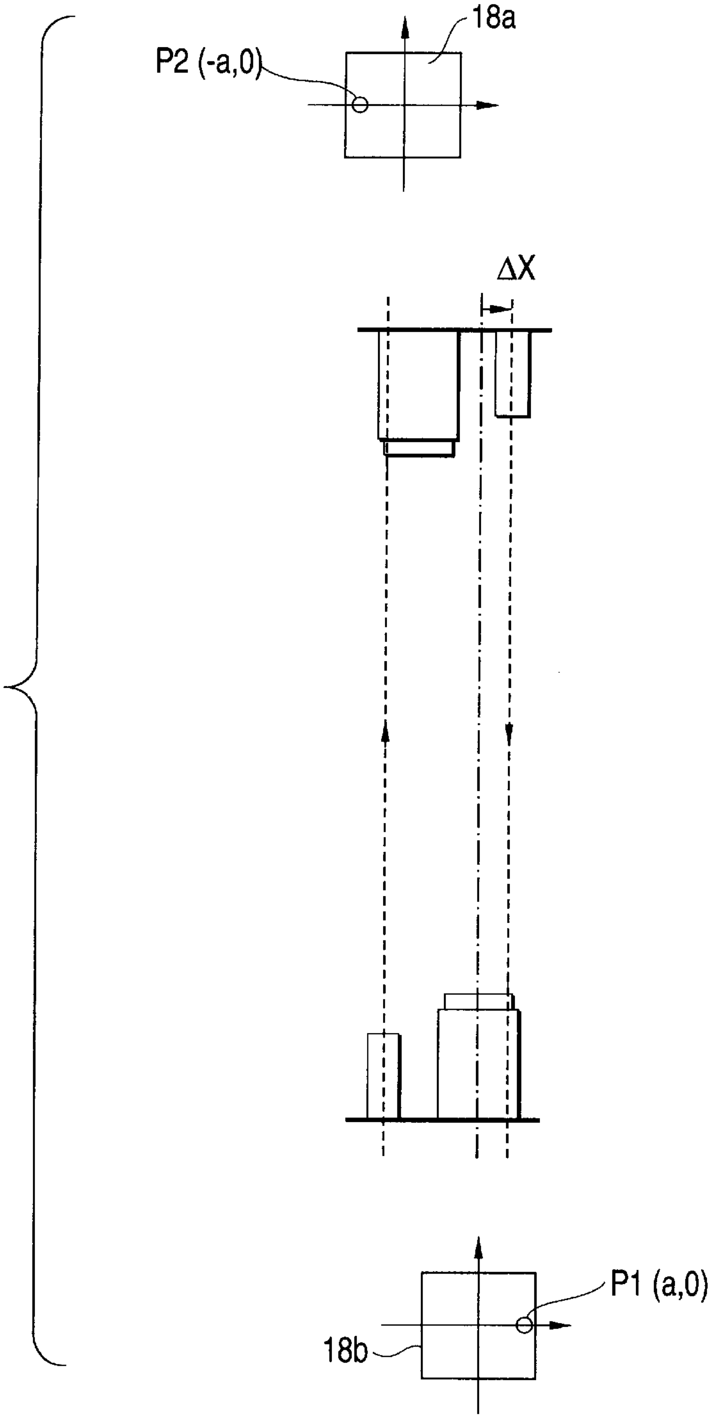
FIG. 3 is a schematic view showing the principle of the parallel displacement/inclination measuring apparatus according to the embodiment 1 of the present invention.
Figure 4:
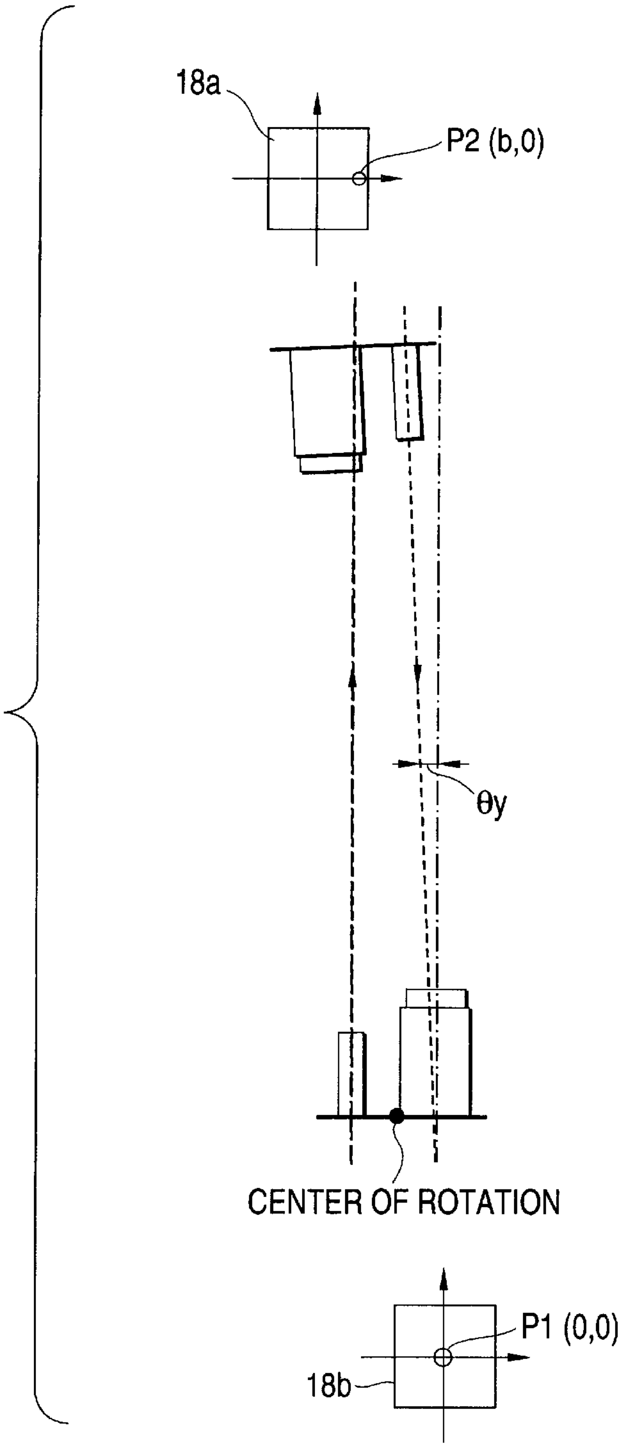
FIG. 4 is a schematic view showing the principle of the parallel displacement/inclination measuring apparatus according to the embodiment 1 of the present invention.

Next, the measuring principle of the displacement and the inclination will be explained hereunder. In FIG. 2, 18*a* and 18*b* are images from the image sensors 13*a* and 13*b*. FIG. 2 shows the initial set state, FIG. 3 shows the state in which a parallel displacement ΔX is generated, and FIG. 4 shows the state in which a rotation θy is generated. The image sensor senses the positional displacement of the laser beam in the two-dimensional plane. In this case, the laser pointer and the image sensor, which are positioned vertically, are set as one measuring system, and then two measuring systems are arranged such that respective laser beams can be irradiated in the opposite directions. At this time, as shown in FIG. 1, one laser pointer and one image sensor are arranged in the measuring reference portion, and also another laser pointer and another image sensor are arranged in the measured portion. The parallel displacement ΔX and the inclination θ are calculated separately based on measured results by these two measuring systems.

As shown in FIG. 3, assume that positions of the laser beams of the images 18*a* and 18*b* are set to P1 (X1, Y1)—, P2 (X2, Y2), if the measured portion is displaced by ΔX in the X-axis direction, the ΔX is given by $$\Delta X = X1 = -X2 \tag{1}$$

In contrast, as shown in FIG. 4, if the measured portion is rotated by Δθy on the Y-axis, when a distance L between the measured portion 10 and the measuring reference portion 11, only the value X2 is changed and given by $$\tan(\Delta\theta y) = X2/L \tag{2}$$

Based on these facts, if displacement ΔX and the rotation Δθ are generated simultaneously, $$\Delta X = X1 \tag{3}$$

$$\tan(\Delta\theta y) = (X1 + X2)/L \tag{4}$$

are given.

According to Eq. (4), $\Delta\theta y$ is calculated as $$\Delta\theta y = \tan^{-1}((X1+X2)/L) \tag{5}$$

Thus, the parallel displacement can be calculated by Eq. (3) and the rotation can be calculated by Eq. (5).

In this case, if the laser beams emitted from the laser pointer 12*a* and the laser pointer 12*b* are sufficiently narrow, positions of the laser beams measured by the image sensor 13*a* and the image sensor 13*b* can be identified by pixels on the image sensor 13*a* and the image sensor 13*b*. Then, the pixel positions may be output from the center-of-gravity position calculating circuit 15*a* and the center-of-gravity position calculating circuit 15*b*. However, actually the laser beam emitted from the laser pointer is thicker than the pixel size of the image sensor, and thus the laser beam is irradiated onto plural pixels of the image sensor. In this case, as the means for deciding on which pixel of the image sensor mainly the laser beam is irradiated, the center of gravity is sensed. As the means for sensing the center of gravity of the laser beam, there is the method that decides the point, at which a total sum of products of output values of respective pixels of the image sensor and distances from the center position becomes 0, as the center-of-gravity position (center-of-gravity pixel). For example, in case an output of the image sensor is represented by 1 and 0, the center-of-gravity position of the laser beam is given as the face-centered position of the irradiation range of the laser beam.

(Embodiment 2)

Figure 5:
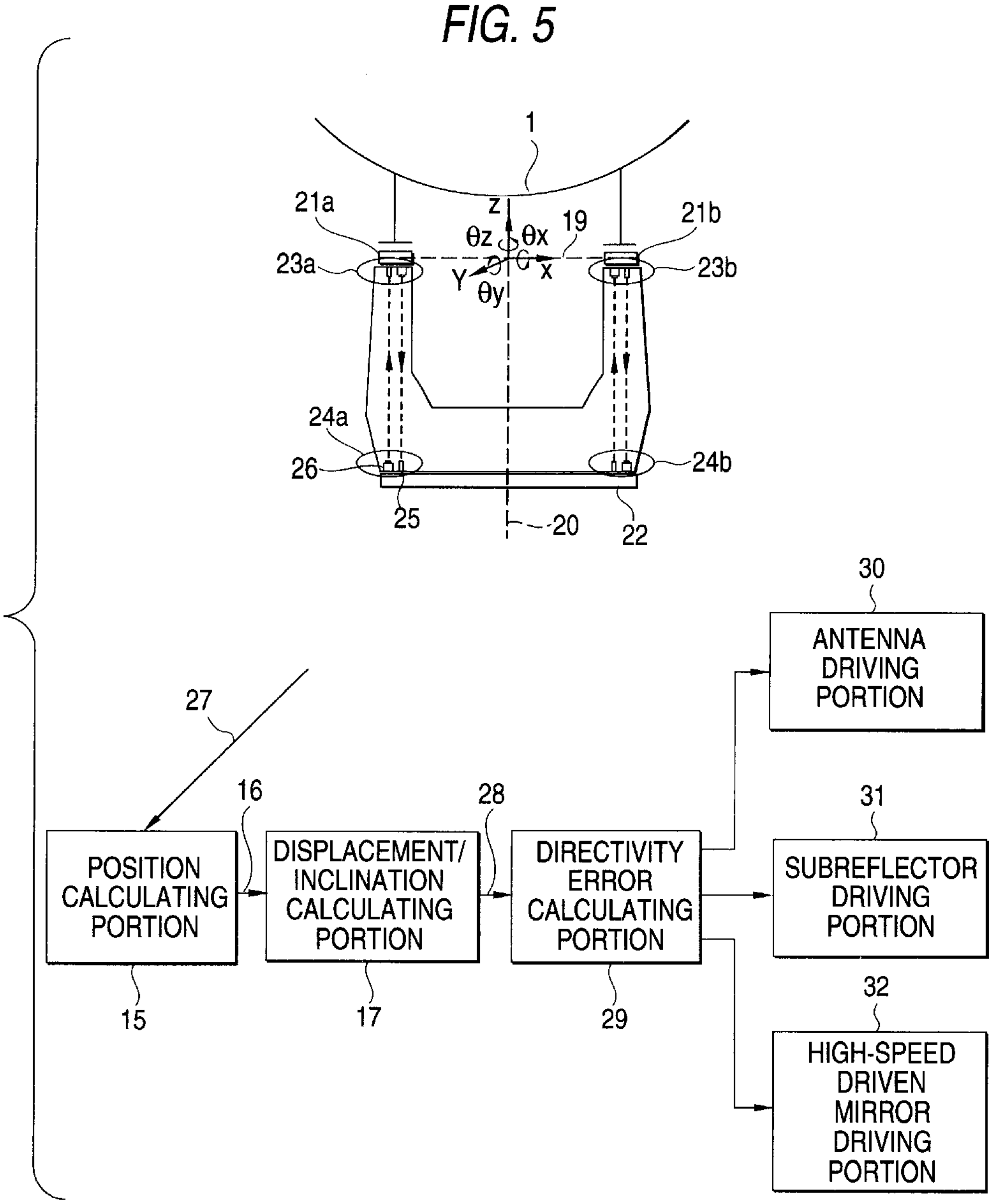
FIG. 5 is a configurative view showing an example of an antenna system according to an embodiment 2 of the present invention.
Figure 6:
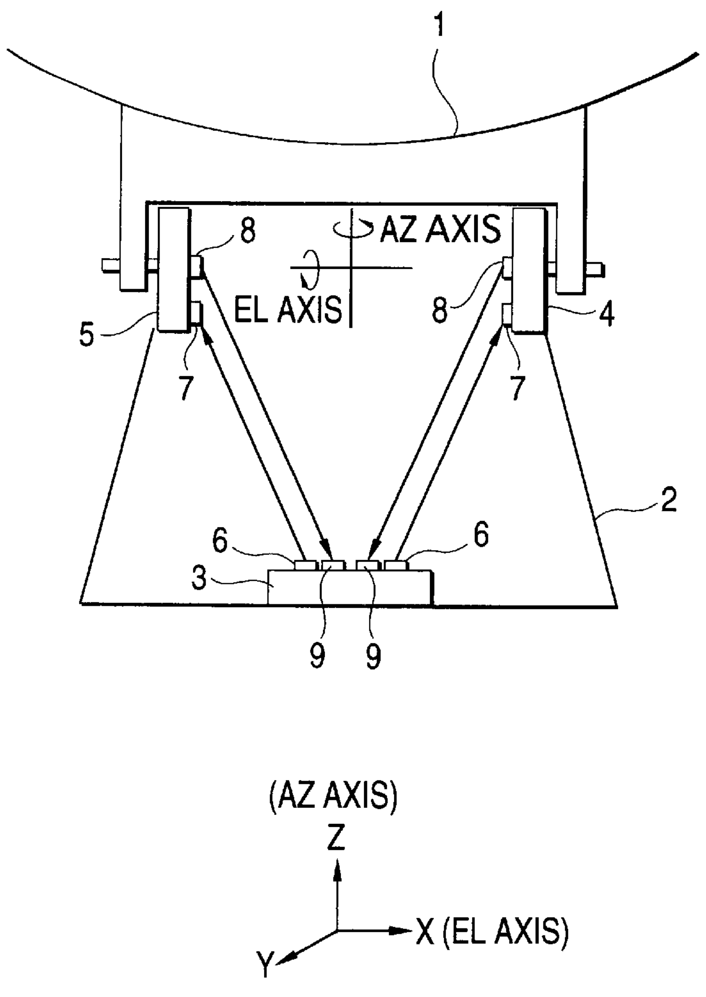
FIG. 6 is a configurative view showing an antenna angle sensing system in the prior art.

An antenna system according to an embodiment 2 of the present invention will be explained with reference to FIG. 5 hereunder. FIG. 5 is a configurative view showing an example of the antenna system according to the embodiment 2 of the present invention. In FIG. 5, 19 is an elevation angle axis (EL axis) of the antenna, and 20 is an azimuth angle (AZ axis) of the antenna. Also, 21*a* and 21*b* are EL-axis bearings provided to the elevation angle axis 19. These EL-axis bearings 21*a*and 21*b* support an antenna 1 such that the antenna 1 can be rotated on the elevation angle axis 19 of the antenna pedestal 2. Also, 22 is an AZ-axis bearing, and this AZ-axis bearing 22 supports rotatably the antenna pedestal 2 on the azimuth angle axis. Also, 23*a* and 23*b* are antenna supporting portions that are positioned under the EL-axis bearings 21*a* and 21*b* and are positioned at top portions of the antenna pedestal 2. The top portions 23*a* and 23*b* of the antenna pedestal 2 correspond to the measured portion 10 in the embodiment 1. Also, 24*a* and 24*b* are antenna pedestal fitting portions that are positioned over the AZ-axis bearing 22 and positioned at bottom portions of the antenna pedestal 2. The bottom portions 24*a* and 24*b* of the antenna pedestal 2 correspond to the measuring reference portion 11 in the embodiment 1. Also, 25 is a laser pointer serving as a marker, and 26 is a two-dimensional image sensor that picks up the image of the laser pointer. The laser pointer 25 and the image sensor 26 are provided to four locations of the top portions 23*a* and 23*b* of the antenna pedestal 2 and the bottom portions 24*a* and 24*b* of the antenna pedestal 2 in total. A set of the laser pointer 25 and the image sensor 26, onto which the laser beam is irradiated, are provided vertically as a set to supply the irradiation of the laser beam indicated by a dotted line with an arrow in FIG. 5.

Further, in FIG. 5, 27 is the image data supplied from four image sensors 26. Also, 28 is displacement and inclination data of the top portions 23*a* and 23*b* of the antenna pedestal 2, which are calculated by the displacement/inclination calculating portion 17, and 29 is a pointing error calculating portion that calculates the pointing error based on the displacement and inclination data 28. Also, 30 is an antenna driving portion for driving the main reflecting mirror 1 of the antenna on the azimuth angle axis and the elevation angle axis based on the pointing error that is calculated by the pointing error calculating portion 29, 31 is a subreflector driving portion for driving a subreflector based on the pointing error calculated by the pointing error calculating portion 29, and 32 is a high-speed driven mirror driving portion for driving a mirror, whose direction of the directivity can be driven at high speed, based on the pointing error calculated by the pointing error calculating portion 29. In this case, in FIG. 5, the portions to which the same symbols as those in FIG. 1 are affixed denote the portions that are identical or equivalent to these portions.

In the embodiment 2, the bottom portions 24*a* and 24*b* of the antenna pedestal 2, at which the deformation acting as the cause of the antenna pointing error is small, are used as the measuring reference portion. Also, the top portions 23*a* and 23*b* of the antenna pedestal 2 are used as the measured portion. It may be considered that, if the thermal deformation of the overall antenna system or the deformation due to the wind pressure is caused, the parallel displacement and the inclination are produced at the top portions 23*a* and 23*b* of the antenna pedestal 2 and thus the direction of the antenna directivity is changed by the parallel displacement and the inclination. The laser pointer 25 and the image sensor 26 are arranged at these portions 23*a* and 23*b*, 24*a* and 24*b* respectively. The laser pointer 25 and the image sensor 26 are provided to the measuring reference portion and the measured portion to oppose to each other. Two sets of the laser pointer 25 and the image sensor 26 (the upper and lower laser pointers and the upper and lower image sensors, which are connected by a dotted line with an arrow in FIG. 5, are used as one set) are provided to the right and left sides of the antenna pedestal 2 respectively, i.e., four sets of them are provided in total.

Since the laser pointers 25 and the image sensors 26 are provided in this manner, the parallel displacement and the inclination of the right and left measured portions of the antenna pedestal 2, i.e., the top portions 23*a* and 23*b* of the antenna pedestal 2 can be calculated respectively. If the top portion 23*a* and the bottom portion 24*a* of the antenna pedestal 2, for example, are particularly observed, this arrangement constitutes the parallel displacement/inclination measuring apparatus shown in FIG. 1. The means and method of calculating the parallel displacement and the inclination of the measured portion by this measuring apparatus are the same as described in the embodiment 1. In addition, if the top portion 23*b* and the bottom portion 24*b* of the antenna pedestal 2 are observed, the same is true.

The pointing error calculating portion 29 calculates the antenna pointing error based on the parallel displacement and the inclination, which are measured/calculated at the top portions 23*a* and 23*b* of the antenna pedestal 2. Assume that an amount of inclination on the X axis (the elevation angle axis) measured/calculated at the top portions 23*a* and 23*b* of the antenna pedestal 2 is $\Delta\theta xa$ and $\Delta\theta xb$ respectively, the pointing error $\theta x$ on the EL axis and the pointing error $\theta z$ on the AZ axis can be calculated by following equations.

$$\theta x = (\Delta\theta xa + \Delta\theta xb)/2 \tag{6}$$

$$\theta z = (\Delta\theta xa - \Delta\theta xb)/2 \tag{7}$$

The antenna driving portion 30 feedback-drives the antenna on the azimuth angle axis and the elevation angle axis based on the pointing error calculated in this way to correct the pointing error. As for the pointing error that is changed at the high frequency, the subreflector driving portion 31 that drives a subreflector, whose mass and moment of inertia are smaller than the antenna 1 and the antenna pedestal 2, or the high-speed driven mirror driving portion 32 that drives a high-speed driven mirror feedback-drives these mirrors to correct the pointing error.

In this case, in the embodiment 1 and the embodiment 2, the laser pointer is employed as the marker for the image sensor. Since markers such as the seals having different-colors, the difference of whose images can be discriminated, can be employed as the marker for the image sensor, the versatility can be widened rather than the system of measurement employed in the prior art.

According to the invention set forth in Aspect 1 of the present invention, a simple structure in which the marker and the image sensor are arranged on the measured portion and the measuring reference portion respectively to oppose to each other is employed. Therefore, the restriction on the arrangement of these measuring devices can be reduced, and the parallel displacement and the inclination can be measured.

According to the invention set forth in Aspect 2 of the present invention, the marker and the image sensor are arranged on the top portion and the bottom portion of the antenna pedestal respectively to oppose to each other. Therefore, the restriction on the arrangement of these measuring devices can be reduced, and the parallel displacement and the inclination of the top portion of the antenna pedestal can be measured, and thus the antenna pointing error can be calculated with higher precision.

According to the invention set forth in Aspect 3 of the present invention, the marker and the image sensor are arranged on the right and left portions of the top portion and the right and left portions of the bottom portion of the antenna pedestal respectively to oppose to each other. Therefore, the restriction on the arrangement of these measuring devices can be reduced, and the antenna pointing error can be calculated.

According to the inventions set forth in Aspect 4 to Aspect 6 of the present invention, the direction of the antenna directivity is corrected based on the antenna pointing error that is calculated by arranging the marker and the image sensor on the right and left portions of the top portion and the right and left portions of the bottom portion of the antenna pedestal respectively to oppose to each other. Therefore, the high antenna tracking precision can be attained.

What is claimed is:

1. A parallel displacement/inclination measuring apparatus, comprising:

a first marker for indicating a position provided to a measuring reference portion;

a first image sensor provided to a measured portion to oppose to said first marker;

a second marker for indicating a position provided to the measured portion;

a second image sensor provided to the measuring reference portion to oppose to said second marker;

a position calculating portion for calculating positions of said first marker and said second marker, which are picked up by said first image sensor and said second image sensor; and a displacement/inclination calculating portion for calculating a parallel displacement and an inclination of the measured portion, based on the positions of said first marker and said second marker calculated by the position calculating portion.

2. An antenna system comprising:

an antenna pedestal for supporting an elevation angle driving axis of an antenna;

a first marker for indicating a position provided to a top portion of said antenna pedestal;

a first image sensor provided to a bottom portion of said antenna pedestal to oppose to said first marker;

a second marker for indicating a position provided to the bottom portion of said antenna pedestal;

a second image sensor provided to the top portion of said antenna pedestal to oppose to said second marker;

a position calculating portion for calculating positions of said first marker and said second marker, which are picked up by said first image sensor and said second image sensor; and a displacement/inclination calculating portion for calculating a parallel displacement and an inclination of the top portion of said antenna pedestal, based on the positions of said first marker and said second marker calculated by the position calculating portion.

3. An antenna system comprising:

an antenna pedestal for supporting an elevation angle driving axis of an antenna;

first markers for indicating positions provided to right and left portions of a top portion of said antenna pedestal respectively;

first image sensors provided to right and left portions of a bottom portion of said antenna pedestal respectively to oppose to said first markers;

second markers for indicating positions provided to right and left portions of the bottom portion of said antenna pedestal respectively;

second image sensors provided to right and left portions of the top portion of said antenna pedestal respectively to oppose to said second markers;

a position calculating portion for calculating positions of said first markers and said second markers, which are picked up by said first image sensors-and said second image sensors;

a displacement/inclination calculating portion for calculating parallel displacements and inclinations of the right and left portions of the top portion of said antenna pedestal, based on the positions of said first markers and said second markers calculated by the position calculating portion; and a pointing error calculating portion for calculating an antenna pointing error based on the parallel displacements and the inclinations of the right and left portions of the top portion of said antenna pedestal calculated by the displacement/inclination calculating portion.

4. The antenna system according to claim 3, further comprising:

an antenna driving portion for driving said antenna on an azimuth angle or elevation angle axis based on said antenna pointing error calculated by the pointing error calculating portion to correct a direction of an antenna directivity.

5. The antenna system according to claim 3, further comprising:

a subreflector driving portion for driving a subreflector based on said antenna pointing error calculated by the pointing error calculating portion to correct a direction of an antenna directivity.

6. The antenna system according to claim 3, further comprising:

a high-speed driven mirror driving portion for driving a high-speed driven mirror based on the antenna pointing error calculated by the pointing error calculating portion to correct a direction of an antenna directivity.

* * * * *